(12) United States Patent
Amanuma et al.

(10) Patent No.: US 7,518,377 B2
(45) Date of Patent: Apr. 14, 2009

(54) MEASUREMENT APPARATUS, TEST APPARATUS, AND MEASUREMENT METHOD

(75) Inventors: Seiji Amanuma, Tokyo (JP); Kiyonobu Suzuki, Tokyo (JP)

(73) Assignee: Advantest Corporation, Tokyo (JP)

( * ) Notice: Subject to any disclaimer, the term of this patent is extended or adjusted under 35 U.S.C. 154(b) by 211 days.

(21) Appl. No.: 11/698,744

(22) Filed: Jan. 26, 2007

(65) Prior Publication Data

US 2007/0197168 A1 Aug. 23, 2007

(30) Foreign Application Priority Data

Jan. 31, 2006 (JP) ............................. 2006-023273

(51) Int. Cl.
*G01R 31/02* (2006.01)
*G01R 27/08* (2006.01)
(52) U.S. Cl. ...................................... 324/537; 324/713
(58) Field of Classification Search ................. 324/537, 324/713
See application file for complete search history.

(56) References Cited

U.S. PATENT DOCUMENTS

| | | | |
|---|---|---|---|
| 5,200,696 A * | 4/1993 | Menis et al. ............... | 324/73.1 |
| 6,498,473 B1 * | 12/2002 | Yamabe ..................... | 324/765 |
| 7,049,850 B2 * | 5/2006 | Shimizu ..................... | 326/100 |
| 2005/0144539 A1 * | 6/2005 | Orita ......................... | 714/48 |

* cited by examiner

*Primary Examiner*—Timothy J Dole
(74) *Attorney, Agent, or Firm*—Osha • Liang LLP

(57) ABSTRACT

A signal whose voltage level fluctuates with respect to a high voltage is measured with favorable accuracy. Provided is a measurement apparatus for measuring a fluctuation of a voltage level of an input signal with respect to a reference voltage, where the voltage level of the input signal fluctuates with respect to the reference voltage having a predetermined voltage level, the measurement apparatus including: a high-frequency passage section for allowing passage of a high-frequency component of a predetermined first band of the input signal; a reference voltage dividing section for dividing a voltage level of the reference voltage at a predetermined voltage dividing ratio; a signal voltage dividing section for dividing the voltage level of the input signal at the voltage dividing ratio; a low-frequency passage section for allowing passage of a low-frequency component of a second band of a differential signal that is according to a difference between a voltage level of the reference voltage outputted from the reference voltage dividing section and a voltage level of the input signal outputted from the signal voltage dividing section, the second band being lower than the first band; a composite section for combining a signal outputted from the high-frequency passage section and a signal outputted from the low-frequency passage section; and a measurement section for measuring a signal outputted from the composite section.

12 Claims, 5 Drawing Sheets

MEASUREMENT APPARATUS, TEST APPARATUS, AND MEASUREMENT METHOD

CROSS REFERENCE TO RELATED APPLICATION

The present application claims priority from a Japanese Patent Applications No. 2006-023273 filed on Jan. 31, 2006, the contents of which are incorporated herein by reference.

BACKGROUND

1. Technical Field

The present invention relates to a measurement apparatus and a test method for measuring an input signal, and a test apparatus that is equipped with such a measurement apparatus. In particular, the present invention relates to a measurement apparatus that measures a fluctuation of a voltage level of an input signal with respect to a reference voltage, where the voltage level of the input signal fluctuates with respect to the reference voltage having a predetermined voltage level.

2. Related Art

In recent years, a demand is increasing for "HVIC" (High Voltage Integrated Circuit) that outputs a signal having a high voltage. For example, devices controlling motors of electric cars use such HVICs.

HVICs are devices that output a signal having predetermined amplitude with respect to about 0-2 kV for example. In testing such an HVIC, a test apparatus supplies, to an HVIC, a reference voltage having a high voltage of about 0-2 kV. In addition, the test apparatus detects a data pattern of an output signal, and judges quality of a device under test based on the data pattern.

SUMMARY

However, a voltage level of an output signal of an HVIC, fluctuates with respect to a high voltage of about 2 kV for example. In view of this, a measurement means of a high withstand voltage becomes necessary to measure such a signal. In addition, when an HVIC further outputs a signal whose reference is a ground potential, it is desirable that a test apparatus has a measurement means for high-voltage signals and a measurement means for low-voltage signals. However, from a cost point of view, it is not desirable to provide measurement sections respectively for high-voltage signals and low-voltage signals.

Therefore, an advantage of the present invention is to provide a measurement apparatus, a measurement method, and a test apparatus that are able to solve the foregoing problems. This advantage is achieved by combinations of features described in the independent claims. The dependent claims define further advantageous and exemplary combinations of the present invention.

So as to solve the foregoing problems, according to the first aspect of the present invention, there is provided a measurement apparatus for measuring a fluctuation of a voltage level of an input signal with respect to a reference voltage, where the voltage level of the input signal fluctuates with respect to the reference voltage having a predetermined high voltage level, the measurement apparatus including: a high-frequency passage section for allowing passage of a high-frequency component of a predetermined first band of the input signal; a reference voltage dividing section for dividing a voltage level of the reference voltage at a predetermined voltage dividing ratio; a signal voltage dividing section for dividing the voltage level of the input signal at the voltage dividing ratio; a low-frequency passage section for allowing passage of a low-frequency component of a second band of a differential signal that is according to a difference between a voltage level of the reference voltage outputted from the reference voltage dividing section and a voltage level of the input signal outputted from the signal voltage dividing section, the second band being lower than the first band; a composite section for combining a signal outputted from the high-frequency passage section and a signal outputted from the low-frequency passage section; and a measurement section for measuring a signal outputted from the composite section.

The high-frequency passage section may output a differential waveform of the input signal, and the low-frequency passage section outputs an integral waveform obtained by integrating a difference between the voltage level of the reference voltage outputted from the reference voltage dividing section and the voltage level of the input signal outputted from the signal voltage dividing section.

The high-frequency passage section may include: a buffer that allows passage of the input signal; and a high-pass filter that allows passage of a frequency component of the first band of the input signal outputted from the buffer. The low-frequency passage section may include: a differential circuit that outputs the differential signal obtained from amplifying, at an amplification factor that is according to the voltage dividing ratio, the difference between the voltage level of the reference voltage outputted from the reference voltage dividing section and the voltage level of the input signal outputted from the signal voltage dividing section.

The low-frequency passage section may further include a low-pass filter that allows passage of a frequency component of the second band of the differential signal outputted from the differential circuit. The second band may be substantially adjacent to a low frequency side of the first band.

A cut-off frequency of the first band may be substantially equal to a cut-off frequency of the second band. A roll-off factor of the first band may be substantially equal to a roll-off factor of the second band. An amplitude gain for the high-frequency passage section may be substantially equal to an amplitude gain for the low-frequency passage section.

According to the second aspect of the present invention, there is provided a test apparatus for testing a device under test, the test apparatus including: a reference voltage application section for applying a reference voltage to the device under test, the reference voltage defining a reference of a voltage level of an output signal outputted from the device under test; a measurement apparatus for measuring the output signal; and a judgment section for judging quality of the device under test based on the output signal measured by the measurement apparatus, where the measurement apparatus includes: a high-frequency passage section for allowing passage of a high-frequency component of a predetermined first band of the output signal; a reference voltage dividing section for dividing a voltage level of the reference voltage at a predetermined voltage dividing ratio; a signal voltage dividing section for dividing the voltage level of the output signal at the voltage dividing ratio; a low-frequency passage section for allowing passage of a low-frequency component of a second band of a differential signal that is according to a difference between a voltage level of the reference voltage outputted from the reference voltage dividing section and a voltage level of the output signal outputted from the signal voltage dividing section, the second band being lower than the first band; a composite section for combining a signal outputted from the high-frequency passage section and a signal outputted from the low-frequency passage section; and a measurement section for measuring a signal outputted from the composite section.

The device under test may include: a low-voltage driving section for outputting a first output signal whose reference is a predetermined voltage level; and a high-voltage driving section for outputting a second output signal whose reference is the reference voltage having a higher voltage than a reference voltage level of the first output signal, and the measurement apparatus may measure the second output signal.

According to the third aspect of the present invention, there is provided a measurement method for measuring a fluctuation of a voltage level of an input signal with respect to a reference voltage, where the voltage level of the input signal fluctuates with respect to the reference voltage having a predetermined voltage level, the measurement method including: a high-frequency passage step for allowing passage of a high-frequency component of a predetermined first band of the input signal; a reference voltage dividing step for dividing a voltage level of the reference voltage at a predetermined voltage dividing ratio; a signal voltage dividing step for dividing the voltage level of the input signal at the voltage dividing ratio; a low-frequency passage step for allowing passage of a low-frequency component of a second band of a differential signal that is according to a difference between a voltage level of the reference voltage outputted in the reference voltage dividing step and a voltage level of the input signal outputted in the signal voltage dividing step, the second band being lower than the first band; a composite step for combining a signal generated in the high-frequency passage step and a signal generated in the low-frequency passage step; and a measurement step for measuring a signal generated in the composite step.

The summary of the invention does not necessarily describe all necessary features of the present invention. The present invention may also be a sub-combination of the features described above.

DESCRIPTION OF EXEMPLARY EMBODIMENTS

The invention will now be described based on the preferred embodiments, which do not intend to limit the scope of the present invention, but exemplify the invention. All of the features and the combinations thereof described in the embodiment are not necessarily essential to the invention.

Figure 1:
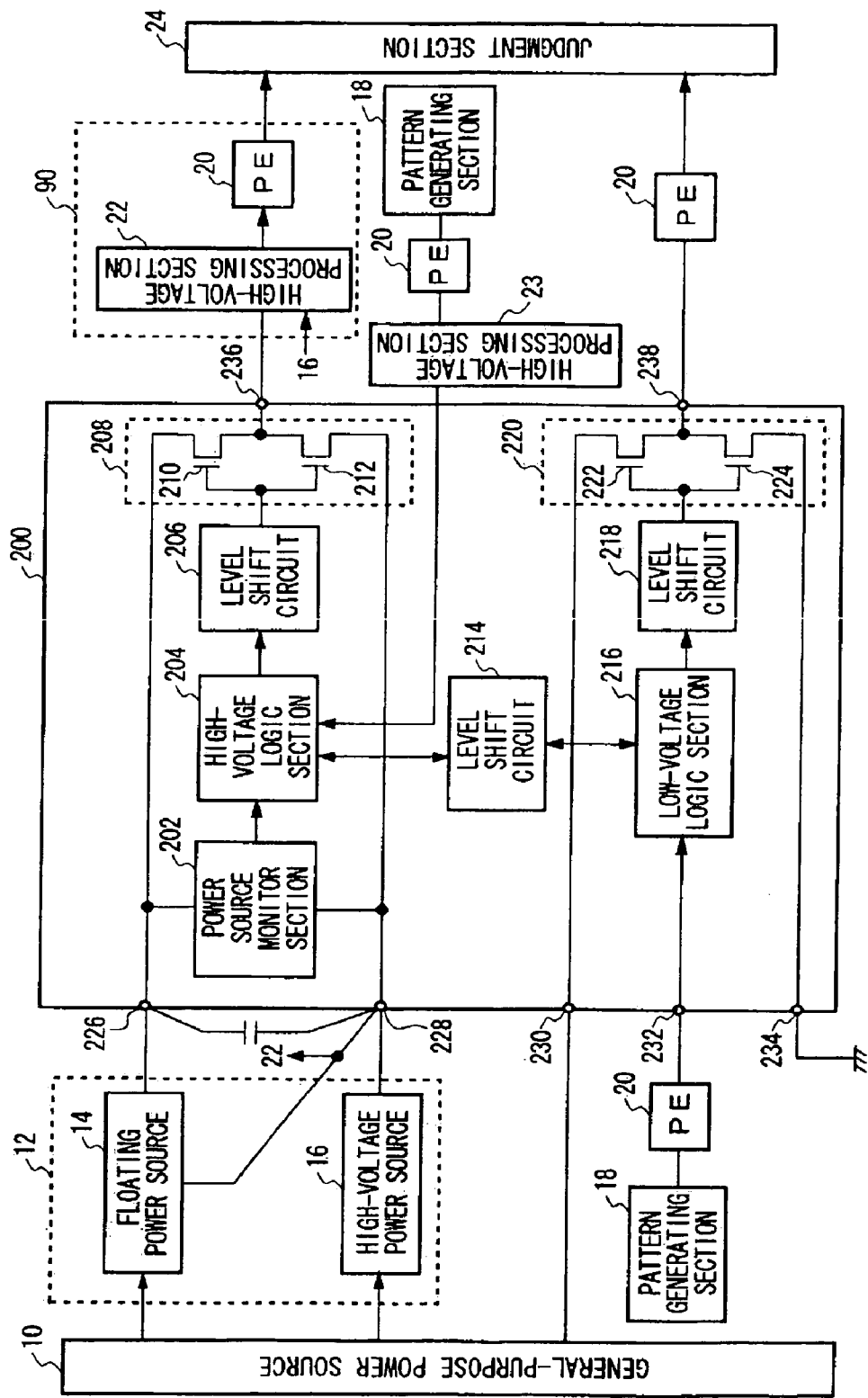
FIG. 1 is a diagram showing one example of a configuration of a test apparatus 100 regarding an embodiment of the present invention.

FIG. 1 is a diagram showing one example of a configuration of a test apparatus 100 regarding an embodiment of the present invention. The test apparatus 100 tests a device under test 200 such as a semiconductor circuit, the device under test 200 operating by being provided with a reference voltage of a predetermined high voltage.

The device under test 200 is for example a device that outputs a first output signal having a waveform whose reference is a ground potential for example, and a second output signal having a waveform whose reference is a high voltage of about 0-2 kV for example. The device under test 200 includes a power source monitor section 202, a high-voltage logic section 204, a level shift circuit 206, a high-voltage driving section 208, a level shift circuit 214, a low-voltage logic section 216, a level shift circuit 218, a low-voltage driving section 220, and a plurality of input/output pins (226-238).

The input/output pins 234 and 230 are supplied with a voltage based on a first reference voltage. In the present example, the first reference voltage is the ground potential. The input/output pin 234 is supplied with the ground potential, and the input/output pin 230 is supplied with a voltage having a predetermined potential difference with respect to the ground potential.

The low-voltage driving section 220 has transistors 222 and 224, and outputs a first output signal via the input/output pin 238. The low-voltage driving section 220 is given a voltage to be supplied to the input/output pins 234 and 230, and outputs the first output signal having amplitude that is according to a voltage level difference of the voltage. For example, the low-voltage driving section 220 is given a voltage to be supplied to the input/output pin 230 as a voltage level in the case where the first output signal indicates an H logic, and is given a voltage to be supplied to the input/output pin 234 as a voltage level in the case where the first output signal indicates an L logic.

A test pattern is inputted to the input/output pin 232. The low-voltage logic section 216 controls, based on the test pattern, a gate voltage to be inputted to gate terminals of the transistors 222 and 224. Accordingly, the low-voltage driving section 220 outputs a first output signal that is in accordance with the test pattern. The level shift circuit 218 shifts a gate voltage that the low-voltage logic section 216 outputs, to a voltage level that is in accordance with the characteristics of the transistors 222 and 224.

The input/output pins 226 and 228 are given a voltage that is based on the second reference voltage that has a predetermined voltage level difference with respect to the first reference voltage and that has a voltage level that is higher than the first reference voltage. In the present example, the second reference voltage of about 0-2 kV is supplied to the input/output pin 228. In addition, a voltage having a predetermined voltage level difference with respect to the second reference voltage is supplied to the input/output pin 226.

The high-voltage driving section 208 has transistors 210 and 212, and outputs a second output signal via the input/output pin 236. The high-voltage driving section 208 is given a voltage to be supplied to the input/output pins 226 and 228, and outputs the second output signal having amplitude that is according to a voltage level difference of the voltage.

The high-voltage logic section 204 controls, based on the test pattern inputted to the device under test 200, a gate voltage to be inputted to gate terminals of the transistors 210 and 212. Accordingly, the high-voltage driving section 208 outputs a second output signal that is in accordance with the test pattern.

The test pattern may be given to the high-voltage logic section 204 via the input/output pin 232, the low-voltage logic section 216, and the level shift circuit 214. In this case, the level shift circuit 214 shifts a voltage level of the test pattern according to the voltage level difference between the first reference voltage and the second reference voltage. The test pattern may also be given to the high-voltage logic section 204 via a different path from with respect to the low-voltage logic section 216. The level shift circuit 206 shifts the gate voltage outputted from the high-voltage logic section 204, to a voltage level that is in accordance with the characteristics of the transistors 210 and 212.

The test apparatus 100 includes a general-purpose power source 10, a reference voltage application section 12, a pattern generating section 18, a measurement apparatus 90, a high-voltage processing section 23, and a judgment section 24. The general-purpose power source 10 generates power supply for operating the test apparatus 100. In the present example, the general-purpose power source 10 functions as a low-voltage application section for generating a voltage whose reference is the first reference voltage, and applying the generated voltage to the input/output pin 230. Although the input/output pin 234 is connected to the ground potential in the present example, it is alternatively possible that the general-purpose power source 10 applies, to the input/output pin 234, a first reference voltage having a predetermined voltage. According to such a configuration, a power supply voltage is able to be supplied to the low-voltage driving section 220 of the device under test 200.

The reference voltage application section 12 generates a voltage that is based on the second reference voltage, and applies the generated voltage to the input/output pins 226 and 228. For example, the reference voltage application section 12 applies a voltage of about 0-2 kV to the input/output pin 228, and applies, to the input/output pin 226, a voltage of about 15V whose reference is the voltage to be supplied to the input/output pin 228.

The reference voltage application section 12 includes a high-voltage power source 16 and a floating power source 14. The high-voltage power source 16 generates the second reference voltage, and applies the second reference voltage to the input/output pin 228. The floating power source 14 generates a voltage whose reference is the second reference voltage outputted from the high-voltage power source 16, and applies the generated voltage to the input/output pin 226. According to such a configuration, a power supply voltage having a high voltage level is able to be supplied to the high-voltage driving section 208 of the device under test 200.

A pin electronics section 20 includes a plurality of logic pins corresponding to the plurality of input/output pins (226-238) of the device under test 200. Each logic pin is electrically connected to a corresponding one of the input/output pins (226-238). Conveyance of signals, power, or the like between the test apparatus 100 and the device under test 200 is performed via each logic pin of the pin electronics section 20. It should be noted that although FIG. 1 illustrates a plurality of pin electronics sections 20 separated from each other, each logic pin of the pin electronics sections 20 may be provided on a same substrate.

The pattern generating section 18 generates a test pattern and inputs the test pattern to the device under test 200. For generating the test pattern, the pattern generating section 18 may base a test program given in advance.

The measurement apparatus 90 measures a second output signal that is outputted from the high-voltage driving section 208. For example, the measurement apparatus 90 measures a fluctuation of a voltage level of the second output signal with respect to the second reference voltage. The measurement apparatus 90 includes a high-voltage processing section 22 and a pin electronics section 20. Each of the high-voltage processing section 22 and the high-voltage processing section 23 is provided between the device under test 200 and a corresponding pin electronics section 20. The high-voltage processing section 22 receives a second output signal that the high-voltage driving section 208 outputs, and processes the output signal according to the characteristics of the pin electronics section 20. For example, the high-voltage processing section 22 shifts the signal level of the output signal, to a signal level that is in accordance with the withstand voltage of a corresponding logic pin of the pin electronics section 20. Accordingly, even without a pin electronics section 20 of a high withstand voltage, the test apparatus 100 becomes able to detect data of an output signal having a high voltage. The configuration and the operation of the high-voltage processing section 22 are detailed later with reference to the drawings from FIG. 2 to FIG. 5.

The high-voltage processing section 23 receives a test pattern generated by the pattern generating section 18, and processes the test pattern in accordance with the characteristics of the high-voltage logic section 204. For example, the high-voltage processing section 23 may shift a voltage level of the test pattern according to the voltage level difference between the first reference voltage and the second reference voltage, just as the level shift circuit 214.

The judgment section 24 judges the quality of the device under test 200, based on an output signal outputted from the device under test 200. For example, the judgment section 24 may judge the quality of the device under test 200, based on a judgment as to whether the data pattern of the output signal outputted from the low-voltage driving section 220 and/or from the high-voltage driving section 208 matches the data pattern of a given expected-value signal. In this case, the pattern generating section 18 may generate the expected-value signal according to a test program.

The judgment section 24 may also judge whether the second reference voltage outputted from the high-voltage power source 16 lies within a predetermined expected voltage range. The judgment section 24 may judge quality of a device under test 200 based on an output signal, on condition that the voltage level of the second reference voltage lies within the expected voltage range. According to such a configuration, the test apparatus 100 is able to judge, with favorable accuracy, the quality of the device under test 200 that is driven with a high voltage.

The judgment section 24 may detect a voltage level of a second reference voltage in a conveyance path provided between the high-voltage power source 16 and the input/output pin 228. It is desirable that the judgment section 24 detects a voltage level of a second reference voltage from an input terminal (input/output pin 228) of the device under test 200 to which the second reference voltage is inputted.

The power source monitor section 202 monitors voltages to be supplied to the input/output pins 226 and 228, and when the voltages do not lie within a predetermined voltage range, the power source monitor section 202 may stop an operation of the high-voltage logic section 204. In addition, the power source monitor section 202 may monitor whether the difference between the voltages to be supplied to the input/output pins 226 and 228 lies within a predetermined voltage range.

Figure 2:
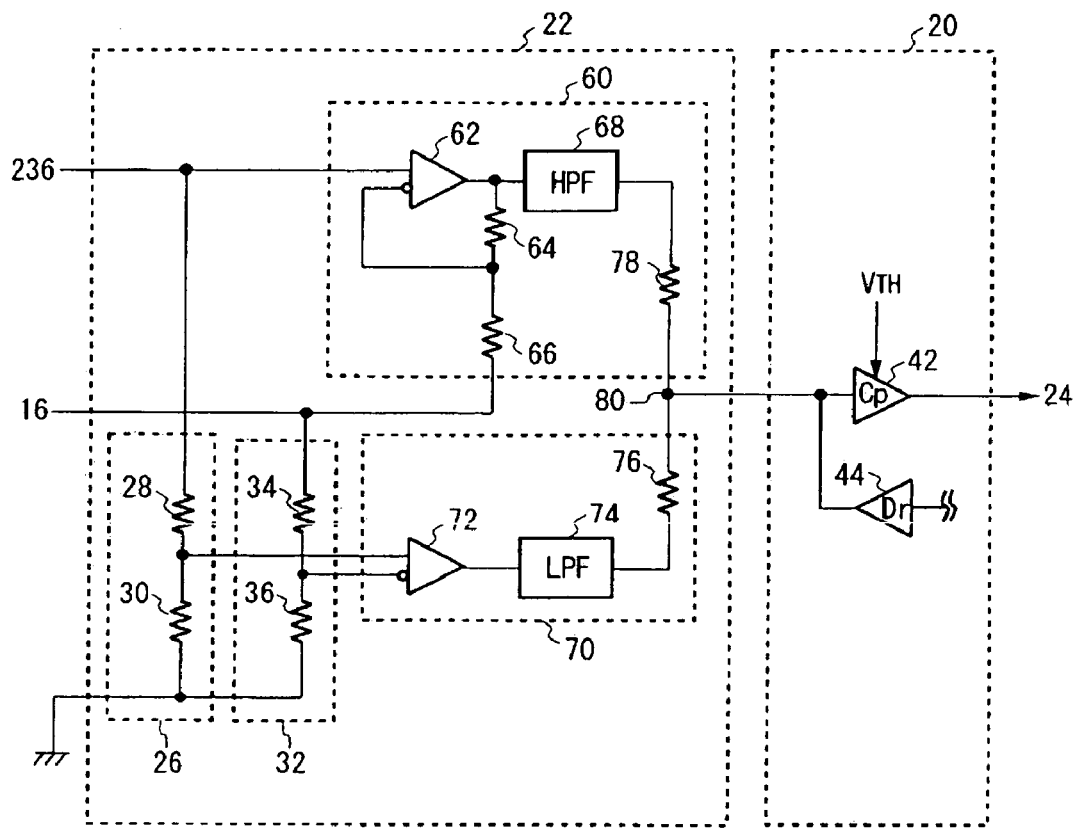
FIG. 2 is a diagram showing one example of a configuration of a high-voltage processing section 22 and a pin electronics section 20.

FIG. 2 is a diagram showing one example of a configuration of the high-voltage processing section 22 and the pin electronics section 20. The high-voltage processing section 22 includes a high-frequency passage section 60, a low-frequency passage section 70, a signal voltage division section 26, a reference voltage division section 32, and a composite section 80.

The high-frequency passage section 60 allows passage of a high frequency component of a predetermined first band of an output signal outputted from a high-voltage driving section 208. The high-frequency passage section 60 may output a differential waveform of the output signal. In addition, the high-frequency passage section 60 may allow passage of an alternate-current component of the output signal. The high-frequency passage section 60 of the present example may have a buffer 62, resistances 64, 66, 78, and a high-pass filter 68.

The buffer 62 receives an output signal from the high-voltage driving section 208 via the input/output pin 236. The buffer 62 allows passage of the output signal after amplifying the amplitude of the output signal by means of a gain that is according to a resistance ratio between the resistances 64 and 66.

The high-pass filter 68 allows passage of a frequency component of a first band of an output signal outputted from the buffer 62. For example, the high-pass filter 68 may include a capacitor provided between the buffer 62 and the resistance 78, and may include a transformer provided between the buffer 62 and the resistance 78. The resistance 78 is provided between the high-pass filter 68 and the composite section 80, and conveys a signal outputted from the high-pass filter 68 to the composite section 80. It is preferable that the buffer 62 is a buffer that operates at a high speed. For example, a signal passage band in the buffer 62 is preferably a band that includes the above-mentioned first band.

The signal voltage division section 26 performs voltage division to a voltage level of an output signal from the high-voltage driving section 208 at a predetermined voltage dividing ratio and outputs the result. The signal voltage division section 26 in the present example has resistances 28 and 30 provided in series between the input/output pin 236 and the ground potential, and performs voltage division to the output signal according to a resistance ratio between the resistances 28 and 30.

The reference voltage division section 32 performs voltage division to the voltage level of the second reference voltage at substantially the same voltage dividing ratio as that used by the signal voltage division section 26, and outputs the result. The reference voltage division section 32 in the present example has resistances 34 and 36 provided in series between the high-voltage power source 16 and the ground potential, and performs voltage division to the second reference voltage according to a resistance ratio between the resistances 34 and 36.

The low-frequency passage section 70 allows passage of a low frequency component of a second band of a differential signal that is according to a difference between a voltage level of the second reference voltage having undergone voltage division by the reference voltage division section 32 and a voltage level of an output signal having undergone voltage division by the signal voltage division section 26. The second band that the low-frequency passage section 70 allows passage is lower than the first band that the high-frequency passage section 60 allows passage. The low-frequency passage section 70 may output an integral waveform resulting from integrating the differential signal. Moreover, the low-frequency passage section 70 may allow passage of a direct-current component of the differential signal.

The low-frequency passage section 70 in the present example has a differential circuit 72 and a low-pass filter 74. The differential circuit 72 outputs a differential signal obtained by amplifying, at a predetermined amplification factor, a difference between the voltage level of the second reference voltage resulting from voltage division by the reference voltage division section 32 and the voltage level of the output signal resulting from voltage division by the signal voltage division section 26.

Here, it is desirable that the amplification factor for the differential circuit 72 is determined based on the voltage dividing ratio for the signal voltage division section 26 and the reference voltage division section 32. For example, the amplification factor for the differential circuit 72 may be a reciprocal number of the voltage dividing ratio for the signal voltage division section 26 and the reference voltage division section 32. For example, when the signal voltage division section 26 outputs an output signal by dividing the voltage thereof to 1/200, the amplification factor of the differential circuit 72 may be 200.

According to such a configuration, an amplitude component of the signal having a high voltage is able to be detected by using a low withstand voltage circuit. Furthermore, the differential circuit 72 may be a so-called instrumentation amplifier. Instrumentation amplifiers have high input impedance, and so are suited for measuring minute signals.

The low-pass filter 74 allows passage of a frequency component of the aforementioned second band that belongs to a differential signal outputted by the differential circuit 72. Moreover, when the signal passage band for the differential circuit 72 is the second band, the low-frequency passage section 70 does not have to be equipped with a low-pass filter 74. The resistance 76 is provided between the low-pass filter 74 and the composite section 80, and conveys, to the composite section 80, a signal outputted from the low-pass filter 74.

The composite section 80 combines a signal outputted from the high-frequency passage section 60 and a signal outputted from the low-frequency passage section 70. For example, the composite section 80 may be a connection point that electrically connects an output end of the high-frequency passage section 60 to an output end of the low-frequency passage section 70. Accordingly, a waveform of a signal outputted from the high-frequency passage section 60 and a waveform of a signal outputted from the low-frequency passage section 70 are added together.

Moreover, the pin electronics section 20 functions as a measurement section that measures a signal outputted from the composite section 80. The pin electronics section 20 has a plurality of logic pins, where each logic pin has a comparator 42 and a driver 44. The comparator 42 is given a predetermined threshold value, and compares a voltage level of a signal outputted from the composite section 80 to the threshold value. The comparator 42 outputs the comparison result. According to such a configuration, the comparator 42 converts an inputted signal into a binary signal.

A reference voltage of a signal outputted from the high-frequency passage section 60 will be the ground potential. In addition, a signal outputted from the low-frequency passage section 70 is based on a difference between an output signal and the second reference voltage. Consequently, a reference voltage of a signal outputted from the low-frequency passage section 70 will also be the ground potential. In addition, a signal outputted from the high-frequency passage section 60 is for example a differential waveform of an output signal, and a signal outputted from the low-frequency passage section 70 is for example an integral waveform of an output signal. Accordingly, by combining these signals, an amplitude component of an output signal is able to be extracted.

In addition, the high-frequency passage section 60 is able to be operated at a high speed, however cannot allow passage of a direct-current component. As opposed to this, the low-frequency passage section 70 cannot operate at a high speed, however is able to allow passage of a direct-current component.

In other words, if with one of either the high-frequency passage section 60 or the low-frequency passage section 70, it is difficult to detect the amplitude waveform of an output signal. As opposed to this, the high-voltage processing section 22 in the present example combines the high-frequency passage section 60 and the low-frequency passage section 70 and combines the outputs from these sections, thereby enabling a low-frequency component and a high-frequency component of an output signal to be detected, and further enabling an amplitude waveform to be detected.

Figure 3:
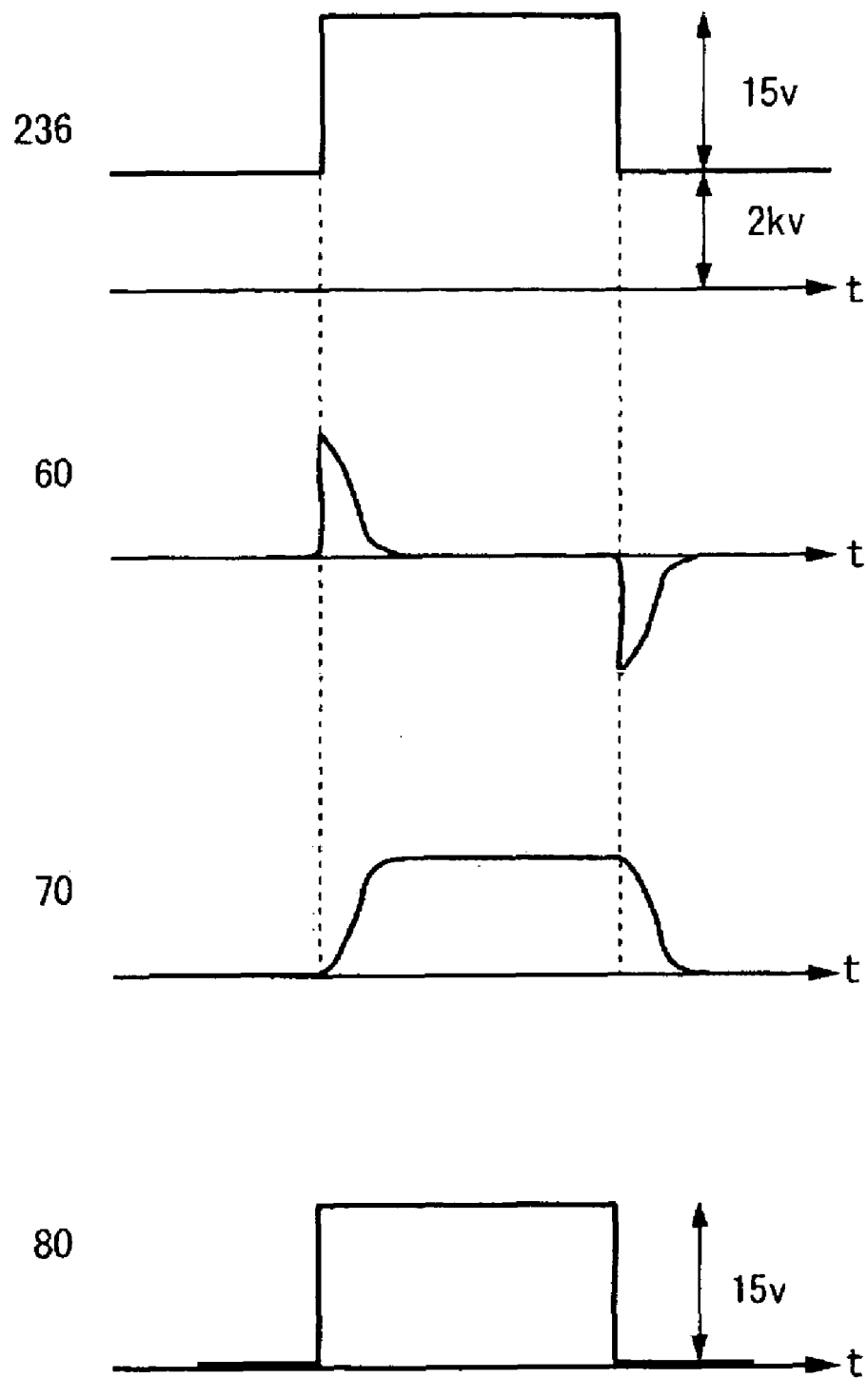
FIG. 3 is a diagram showing one example of an operation of a high-voltage processing section 22.

FIG. 3 is a diagram showing one example of an operation of the high-voltage processing section 22. As shown in FIG. 3, an output signal having a second reference voltage of 2 kV and amplitude of 15V is inputted to the high-voltage processing section 22 in the present example.

As described above, the high-frequency passage section 60 allows passage of a high-frequency component of the output signal, and outputs a differential waveform of the output signal. In addition, the low-frequency passage section 70 allows passage of a low-frequency component of the output signal, and outputs an integral waveform of the amplitude component of the output signal. During this operation, reference voltages of signals outputted from the high-frequency passage section 60 and the low-frequency passage section 70 will be the ground potential.

Then, the composite section 80 combines a signal outputted from the high-frequency passage section 60 and a signal outputted from the low-frequency passage section 70. By performing such processing, an amplitude component of an output signal having a high voltage is able to be detected with favorable responsiveness.

Figure 4:
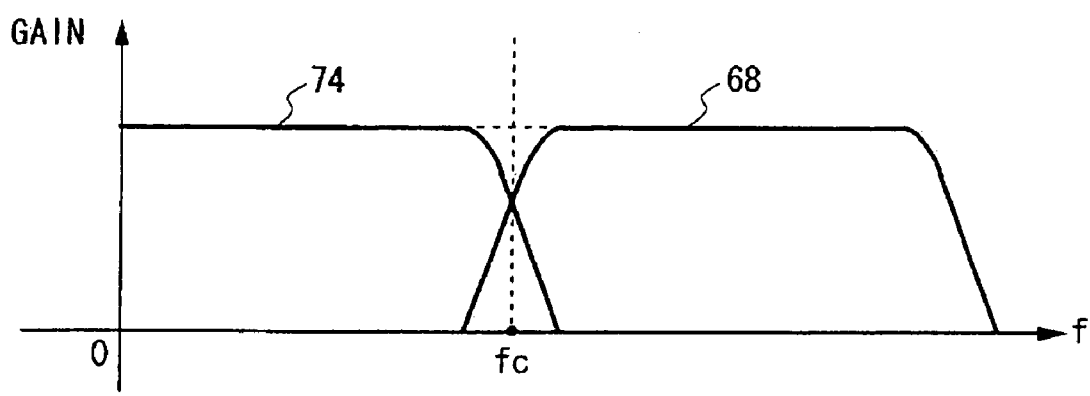
FIG. 4 is a diagram showing one example of a first band for a high-frequency passage section 60 and a second band for a low-frequency passage section 70.

FIG. 4 is a diagram showing one example of a first band for the high-frequency passage section 60 and a second band for the low-frequency passage section 70. It is preferable that the second band is substantially adjacent to a low frequency side of the first band. For example, the second band is a band in a range of the frequency zero to a predetermined cut-off frequency "fc". In addition, the cut-off frequency of the low frequency side of the first band is substantially equal to the cut-off frequency of the high frequency side of the second band. According to this, it becomes possible to allow passage of the frequency component of an output signal without leakage.

Moreover, it is preferable that the roll-off factor of the low frequency side of the first band is substantially equal to the roll-off factor of the high frequency side of the second band. Moreover, it is preferable that the amplitude gain for the high-frequency passage section 60 is substantially equal to the amplitude gain for the low-frequency passage section 70. Accordingly, the distortion of waveforms incident to combining waveforms is able to be lessened.

Figure 5:
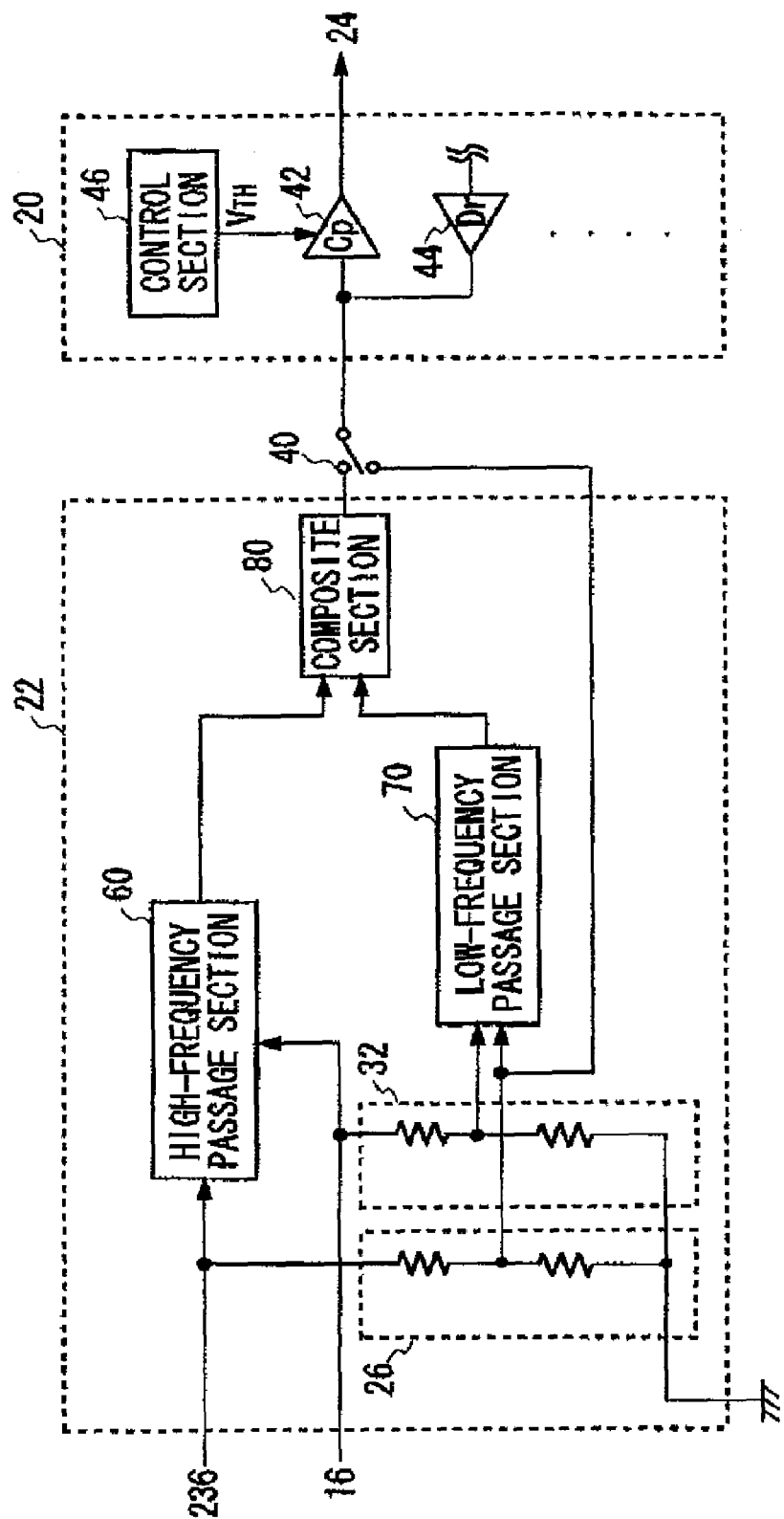
FIG. 5 is a diagram showing another example of a configuration of the high-voltage processing section 22 and the pin electronics section 20.

FIG. 5 is a diagram showing another example of a configuration of the high-voltage processing section 22 and the pin electronics section 20. The high-voltage processing section 22 in the present example is further equipped with a switch section 40 in addition to the configuration of the high-voltage processing section 22 having been described in relation to FIG. 2. The other constituting elements have substantially the same function and configuration as those of the constituting elements assigned the same reference numerals as in FIG. 2.

The switch section 40 switches between inputting, to the pin electronics section 20, an output signal outputted from the composite section 80, or a second reference voltage resulting from voltage division by the reference voltage application section 12. Accordingly, it becomes possible to select a signal to be measured (i.e. either the output signal or the second reference voltage), and inputs the selected signal to the pin electronics section 20.

The test apparatus 100 judges the quality of the device under test 200, based on a judgment as to whether the data pattern of a signal outputted from the composite section 80 matches the data pattern of a given expected-value signal. However, when the second reference voltage does not lie within a predetermined reference voltage range, there is a possibility of misjudging the quality of the device under test 200. To counter this problem, the high-voltage processing section 22 of the present example is further equipped with the switch section 40, thereby enabling the comparator 42 to detect the voltage level of the second reference voltage. Furthermore, because the second reference voltage obtained by voltage division by the reference voltage dividing section 32 is inputted to the comparator 42, the voltage level of the second reference voltage is able to be measured using the comparator 42 that detects the amplitude component of an output signal.

The pin electronics section 20 is further equipped with a control section 46 in addition to the configuration of the pin electronics section 20 having been described in relation to FIG. 2. The other constituting elements have substantially the same function and configuration as those of the constituting elements assigned the same reference numerals as in FIG. 2.

The control section 46 controls a threshold value to be given to the comparator 42. When the comparator 42 measures the voltage level of the second reference voltage, the control section 46 sequentially changes the threshold value to be given to the comparator 42. The comparator 42 also compares each threshold value with the voltage level of the second reference voltage. According to the result of comparison for each threshold value performed by the comparator 42, the voltage level of the second reference voltage is able to be measured.

The measurement of the second reference voltage may be performed prior to testing the device under test 200. For example, the test apparatus 100 may test the device under test 200 if the second reference voltage lies within a predetermined reference voltage range.

Furthermore, the measurement of the second reference voltage may be performed during testing of the device under test 200. In such a case, the high-voltage processing section 22 may input the second reference voltage resulting from voltage division, to a logic pin different from the logic pin of the pin electronics section 20 connected to the composite section 80. In this case, the high-voltage processing section 22 does not have to be equipped with a switch section 40.

In addition, the switch section 40 may operate based on a test program given to the pattern generating section 18. For example, the switch section 40 may detect, based on the test program, a timing when an output signal from the high-voltage driving section 208 is not compared to an expected-value signal, and cause the second reference voltage to be inputted to the comparator 42 at the detected timing. The switch section 40 may operate according to an expected-value signal that the pattern generating section 18 outputs based on the test program. For example, the switch section 40 may input the second reference voltage to the comparator 42 when the pattern generating section 18 does not output an expected-value signal. Alternatively, the switch section 40 may input the second reference voltage to the comparator 42 when the expected-value signal indicates a null value.

As apparent from the above description, the present invention enables to measure, with favorable accuracy, a signal whose voltage level fluctuates with respect to a high voltage, and to test, with favorable accuracy, a device under test that is operated with a high voltage as a reference.

In the above, the present invention has been described by way of an exemplary embodiment. However, it is needless to say that the technical scope of the present invention should not be limited by the above-described embodiment. It should be understood that those skilled in the art might make many changes and substitutions without departing from the spirit and the scope of the present invention. It is obvious from the appended claims that embodiments with such modifications also belong to the scope of the present invention.

What is claimed is:

1. A measurement apparatus for measuring a fluctuation of a voltage level of an input signal with respect to a reference voltage, where the voltage level of the input signal fluctuates with respect to the reference voltage having a predetermined high voltage level, the measurement apparatus comprising:
    a high-frequency passage section for allowing passage of a high-frequency component of a predetermined first band of the input signal;
    a reference voltage dividing section for dividing a voltage level of the reference voltage at a predetermined voltage dividing ratio;
    a signal voltage dividing section for dividing the voltage level of the input signal at the voltage dividing ratio;
    a low-frequency passage section for allowing passage of a low-frequency component of a second band of a differential signal that is according to a difference between a voltage level of the reference voltage outputted from the reference voltage dividing section and a voltage level of the input signal outputted from the signal voltage dividing section, the second band being lower than the first band;
    a composite section for combining a signal outputted from the high-frequency passage section and a signal outputted from the low-frequency passage section; and
    a measurement section for measuring a signal outputted from the composite section.

2. The measurement apparatus according to claim 1, wherein
    the high-frequency passage section outputs a differential waveform of the input signal, and the low-frequency passage section outputs an integral waveform obtained by integrating a difference between the voltage level of the reference voltage outputted from the reference voltage dividing section and the voltage level of the input signal outputted from the signal voltage dividing section.

3. The measurement apparatus according to claim 1, wherein
    the high-frequency passage section includes:
        a buffer that allows passage of the input signal; and
        a high-pass filter that allows passage of a frequency component of the first band of the input signal outputted from the buffer.

4. The measurement apparatus according to claim 3, wherein
    the low-frequency passage section includes:
        a differential circuit that outputs the differential signal obtained from amplifying, at an amplification factor that is according to the voltage dividing ratio, the difference between the voltage level of the reference voltage outputted from the reference voltage dividing section and the voltage level of the input signal outputted from the signal voltage dividing section.

5. The measurement apparatus according to claim 4, wherein
    the low-frequency passage section further includes a low-pass filter that allows passage of a frequency component of the second band of the differential signal outputted from the differential circuit.

6. The measurement apparatus according to claim 5, wherein
    the second band is substantially adjacent to a low frequency side of the first band.

7. The measurement apparatus according to claim 6, wherein
    a cut-off frequency of the first band is substantially equal to a cut-off frequency of the second band.

8. The measurement apparatus according to claim 6, wherein
    a roll-off factor of the first band is substantially equal to a roll-off factor of the second band.

9. The measurement apparatus according to claim 6, wherein
    an amplitude gain for the high-frequency passage section is substantially equal to an amplitude gain for the low-frequency passage section.

10. A test apparatus for testing a device under test, the test apparatus comprising:
    a reference voltage application section for applying a reference voltage to the device under test, the reference voltage defining a reference of a voltage level of an output signal outputted from the device under test;
    a measurement apparatus for measuring the output signal; and
    a judgment section for judging quality of the device under test based on the output signal measured by the measurement apparatus, wherein
    the measurement apparatus includes:
        a high-frequency passage section for allowing passage of a high-frequency component of a predetermined first band of the output signal;
        a reference voltage dividing section for dividing a voltage level of the reference voltage at a predetermined voltage dividing ratio;
        a signal voltage dividing section for dividing the voltage level of the output signal at the voltage dividing ratio;
        a low-frequency passage section for allowing passage of a low-frequency component of a second band of a differential signal that is according to a difference between a voltage level of the reference voltage outputted from the reference voltage dividing section and a voltage level of the output signal outputted from the signal voltage dividing section, the second band being lower than the first band;
        a composite section for combining a signal outputted from the high-frequency passage section and a signal outputted from the low-frequency passage section; and
        a measurement section for measuring a signal outputted from the composite section.

11. The test apparatus according to claim 10, wherein
    the device under test includes:
        a low-voltage driving section for outputting a first output signal whose reference is a predetermined voltage level; and
        a high-voltage driving section for outputting a second output signal whose reference is the reference voltage having a higher voltage than a reference voltage level of the first output signal, and
    the measurement apparatus measures the second output signal.

12. A measurement method for measuring a fluctuation of a voltage level of an input signal with respect to a reference voltage, where the voltage level of the input signal fluctuates with respect to the reference voltage having a predetermined voltage level, the measurement method comprising:

- a high-frequency passage step for allowing passage of a high-frequency component of a predetermined first band of the input signal;
- a reference voltage dividing step for dividing a voltage level of the reference voltage at a predetermined voltage dividing ratio;
- a signal voltage dividing step for dividing the voltage level of the input signal at the voltage dividing ratio;
- a low-frequency passage step for allowing passage of a low-frequency component of a second band of a differential signal that is according to a difference between a voltage level of the reference voltage resulting from voltage division in the reference voltage dividing step and a voltage level of the input signal resulting from voltage division in the signal voltage dividing step, the second band being lower than the first band;
- a composite step for combining a signal generated in the high-frequency passage step and a signal generated in the low-frequency passage step; and
- a measurement step for measuring a signal generated in the composite step.

* * * * *